(12) United States Patent
Seo

(10) Patent No.: US 6,995,070 B2
(45) Date of Patent: Feb. 7, 2006

(54) FABRICATING METHOD OF THIN FILM CAPACITOR

(75) Inventor: Young-Hun Seo, Kyungki-do (KR)

(73) Assignee: DongbuAnam Semiconductor Inc., Seoul (KR)

( * ) Notice: Subject to any disclaimer, the term of this patent is extended or adjusted under 35 U.S.C. 154(b) by 123 days.

(21) Appl. No.: 10/748,045

(22) Filed: Dec. 31, 2003

(65) Prior Publication Data

US 2004/0152277 A1 Aug. 5, 2004

(30) Foreign Application Priority Data

Jan. 30, 2003 (KR) .............................. 10-2003-0006351

(51) Int. Cl.
*H01L 21/00* (2006.01)

(52) U.S. Cl. ...................................................... 438/396
(58) Field of Classification Search ......... 438/386–399; 257/532–535
See application file for complete search history.

(56) References Cited

U.S. PATENT DOCUMENTS

| | | | |
|---|---|---|---|
| 6,159,793 A | 12/2000 | Lou | |
| 6,271,084 B1 | 8/2001 | Tu et al. | |
| 6,387,775 B1 | 5/2002 | Jang et al. | |
| 6,426,250 B1 | 7/2002 | Lee et al. | |
| 6,432,770 B2 | 8/2002 | Lin | |
| 6,436,787 B1 | 8/2002 | Shih et al. | |
| 6,451,667 B1 * | 9/2002 | Ning ......................... 438/397 |

FOREIGN PATENT DOCUMENTS

KR 2001-0068729 7/2001

* cited by examiner

*Primary Examiner*—Evan Pert
(74) *Attorney, Agent, or Firm*—Pillsbury Winthrop Shaw Pittman LLP

(57) ABSTRACT

The present invention is directed to a method of fabricating a capacitor having a metal/insulator/metal (MIM) structure, which is capable of providing a minimized semiconductor device with no capacitance variation of a capacitor. According to an aspect of the present invention, a method of fabricating a thin film capacitor comprises the steps of forming a first via and a second via which are isolated with a predetermined distance by selectively etching an interlayer insulating film formed over the entire structure of a semiconductor substrate, filling in the first via and the second via with a first metal material, forming a capacitor window by etching the interlayer insulating film between the first via and the second via to have a predetermined depth, forming a dielectric layer on an inner wall, and forming a second metal material to fill in the capacitor window.

8 Claims, 3 Drawing Sheets

FABRICATING METHOD OF THIN FILM CAPACITOR

BACKGROUND OF THE INVENTION (a) Field of the Invention

The present invention relates to a method of fabricating a semiconductor device, and more particularly, to a method of fabricating a thin film capacitor having an MIM (Metal/Insulator/Metal) structure.

(b) Description of the Related Art

Recently, in the field of analog circuits requiring high-speed operation, a semiconductor device having higher capacity has being developed. Generally, in case a capacitor has a PIP structure where a polysilicon layer, an insulator layer, and a polysilicon layer are laminated, there is a disadvantage that, as the upper electrode and the lower electrode use conductive polysilicon, oxidation occurs in the interfaces between the electrodes and a dielectric thin film so that natural oxide is formed and thus total capacitance falls.

To solve the disadvantage, the structure of the capacitor has been changed into an MIS (Metal/Insulator/Semiconductor) structure or an MIM structure. Then, the MIM structure thereof has low resistivity and no parasitic capacitance due to depletion therein, such that it is mainly used in high performance semiconductor devices.

Conventional arts related to thin film capacitors are disclosed in U.S. Pat. Nos. 6,436,787; 6,426,250; 6,387,775; 6,271,084; and 6,159,793.

Then, a method of fabricating a thin film capacitor having the conventional MIM structure will be briefly described. FIG. 1 is a cut view showing a thin film capacitor having the conventional MIM structure.

In order to fabricate a capacitor having such conventional MIM structure, first, conventional semiconductor fabricating processes are carried out over a semiconductor substrate 1, and then a lower insulating film 2 is formed.

Next, lower metal wiring 3, a dielectric layer 4, and upper metal wiring 5 are formed on the lower insulating film 2 in order.

Herein, the lower metal wiring 3 corresponds to a first electrode layer of the MIM capacitor, and the upper metal wiring 5 corresponds to a second electrode layer of the MIM capacitor.

Then, the upper metal wiring 5 is selectively etched to have a predetermined width, and then the dielectric layer 4 and the lower metal wiring 3 are selectively etched to have a predetermined width.

As described above, capacitance of the conventional MIM capacitor depends on the size of the upper metal wiring 5.

Then, with higher integration of semiconductor devices, the size of the device has been reduced, such that the size of the upper metal wiring comes to be small. Thus, in order to maintain capacitance with no reduction, while the depth of the dielectric layer or the total size is reduced, various methods for increasing the size between metals with reduced have been researched. Such methods are to improve operating speed by increasing the coupling ratio to ensure capacitance.

However, such methods of increasing the coupling ration with maintaining the capacitance come to reach the limitations, and thus new methods are urgently required.

SUMMARY OF THE INVENTION

In considerations of the above problems, it is an object of the present invention to provide a minimized semiconductor device with no capacitance variation of a capacitor.

To achieve the object described above, according to an aspect of the present invention, a method of fabricating a thin film capacitor comprising steps of forming a first via and a second via which are isolated with a predetermined distance by selectively etching an interlayer insulating film formed over the entire structure of a semiconductor substrate, filling in the first via and the second via with a first metal material, forming a capacitor window by etching the interlayer insulating film between the first via and the second via to have a predetermined depth, forming a dielectric layer on an inner wall, and forming a second metal material to fill in the capacitor window.

BRIEF DESCRIPTION OF THE DRAWINGS

The accompanying drawings, which are incorporated in and constitute a part of the specification, illustrate an embodiment of the invention, and, together with the description, serve to explain the principles of the invention.

DETAILED DESCRIPTION OF THE PREFERRED EMBODIMENT

Hereinafter, a method of fabricating a thin film capacitor according to the present invention will be described in detail.

FIGS. 2a to 2e are cut views showing a method of fabricating a thin film capacitor according to an embodiment of the present invention.

Figure 1:
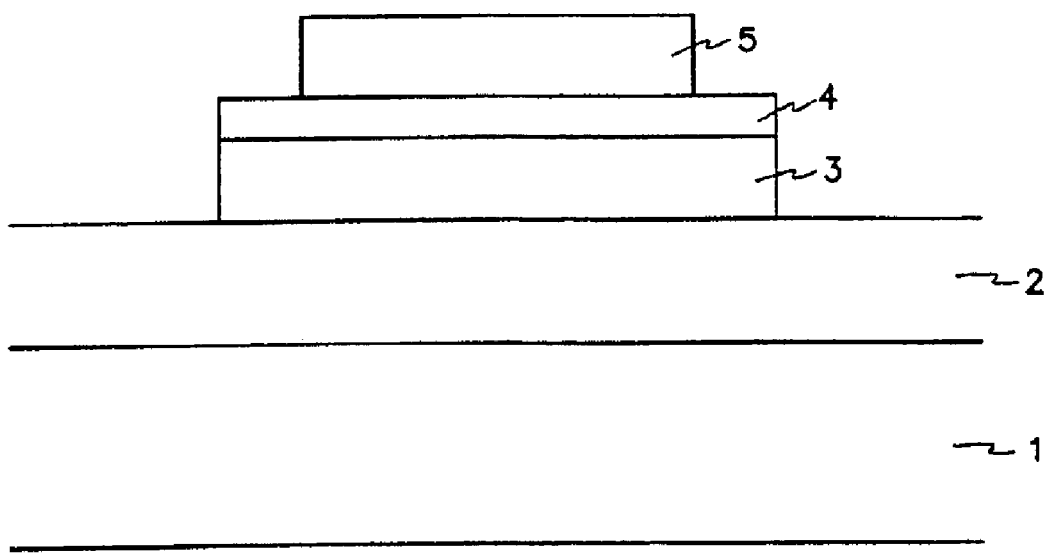
FIG. 1 is a cut view showing a conventional thin film capacitor.
Figure 2A:
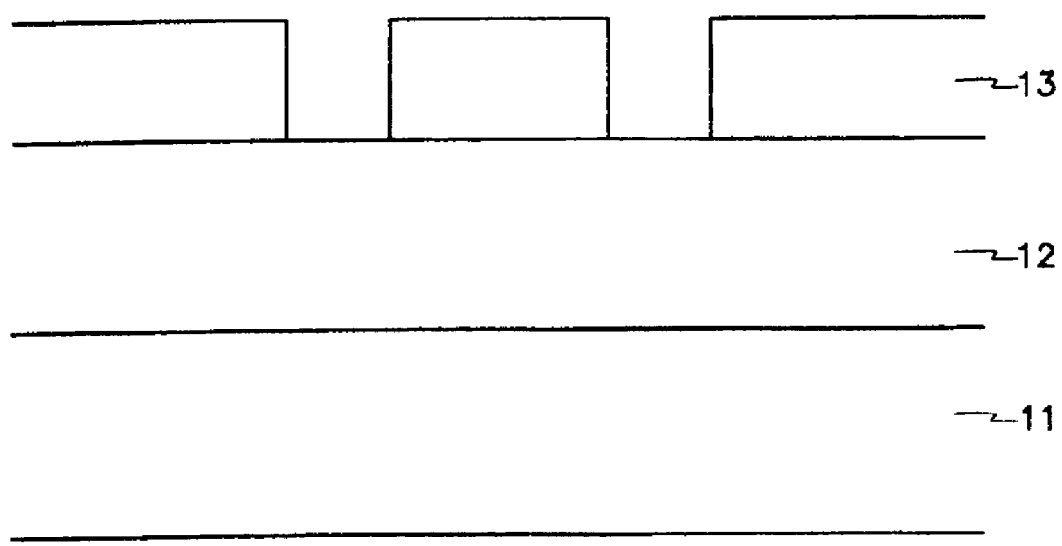
FIGS. 2a to 2e are cut views showing a method of fabricating a thin film capacitor according to an embodiment of the present invention.

First, as shown in FIG. 2a, structure of a semiconductor substrate 11, on which individual elements are formed using a traditional process of forming a semiconductor device, is formed, and then an interlayer insulating film 12 which is composed of oxide such as PSG, etc. is formed on the structure of the semiconductor substrate 11.

Subsequently, photoresistive film is applied on the interlayer insulating film 12, and then exposed and developed to form a first photoresistive pattern 13 exposing predetermined portions in which vias are to be formed. At this point, each via is designed to have a predetermined width and to be a two-line shape isolated to each other with a predetermined distance. Thus, opening portions of the photoresistive film pattern 13 has two lines isolated to each other with a predetermined distance, each line having a predetermined width.

Figure 2B:
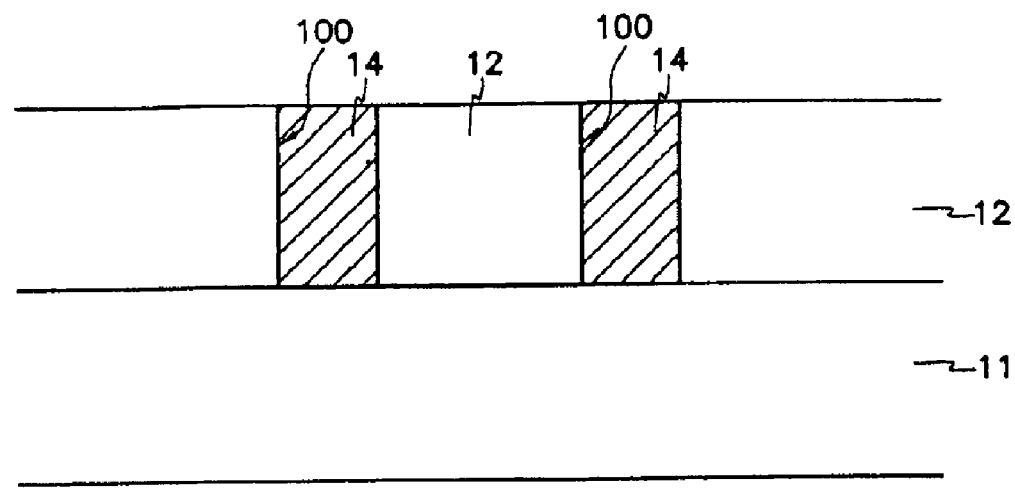

Then, as shown in FIG. 2b, the exposed interlayer insulating film 12 is etched to form vias 100 using the first photoresistive film pattern 13 as a mask, and then the first photoresistive film pattern 13 is removed and a cleaning process is carried out. The vias 100 have two lines isolated to each other with a predetermined distance, each line having a predetermined width.

Subsequently, tungsten 14 is deposited over the entire structure of the interlayer insulating film 12 including the inner portion of the vias 100 to fill in the vias 100, and then planarization of the upper surface is done by carrying out a planarization process of a CMP (Chemical Mechanical Polishing) until the interlayer insulating film 12 is exposed.

Figure 2C:
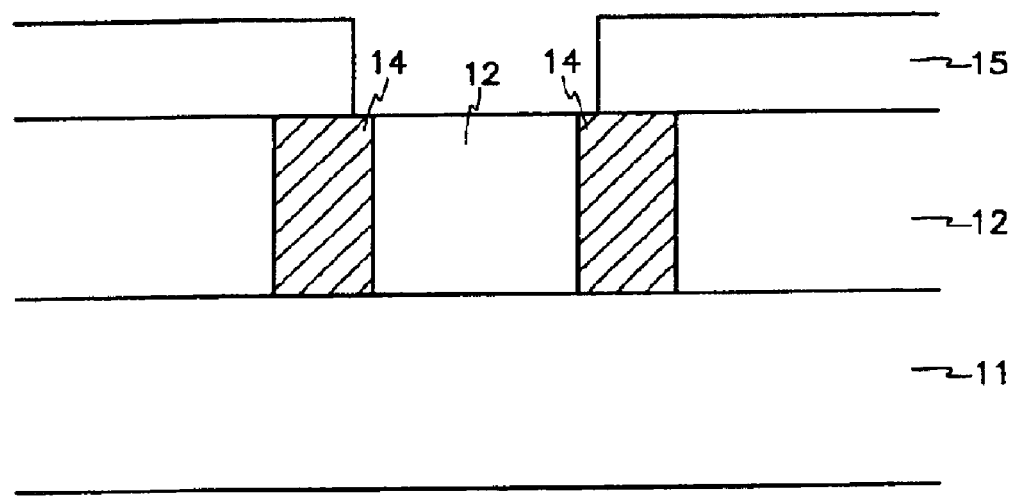

Then, as shown in FIG. 2c, a photoresistive film is applied on the planarized upper surface, and then exposed and developed to form a second photoresistive film pattern 15 exposing the interlayer insulating film 12 located between tungstens 14 filled in the two linear vias 100.

Figure 2D:
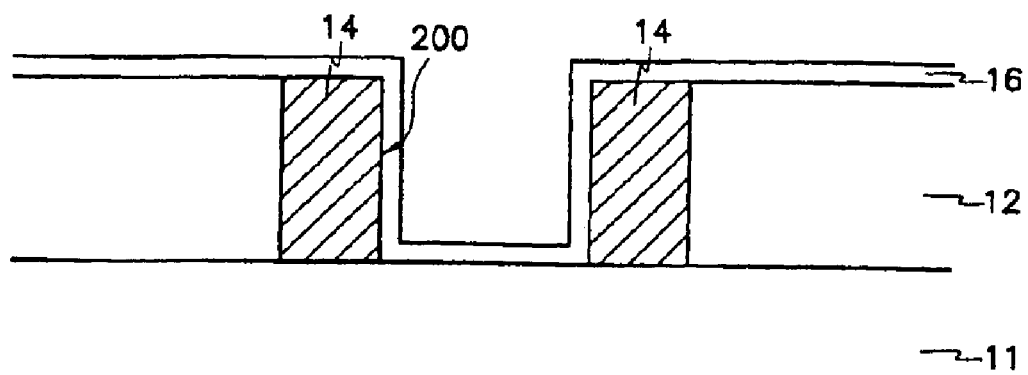

Then, as shown in FIG. 2d, the exposed interlayer insulating film 12 is etched using the second photoresistive film pattern 15 as a mask to have a predetermined thickness, and thus form a capacitor window 200. At this point, because the interlayer insulating film 12 remains in the side wall of the capacitor window 200, the interlayer insulating film 12 is etched to completely remove.

When the interlayer insulating film 12 is etched to from the capacitor window 200, the etch thickness can be controlled in accordance with final capacitance of the capacitor.

Subsequently, a dielectric layer 16 is deposited thinly over the entire upper surface of the tungsten 14 and the interlayer insulating film 12 including the inner wall of the capacitor window 200.

Figure 2E:
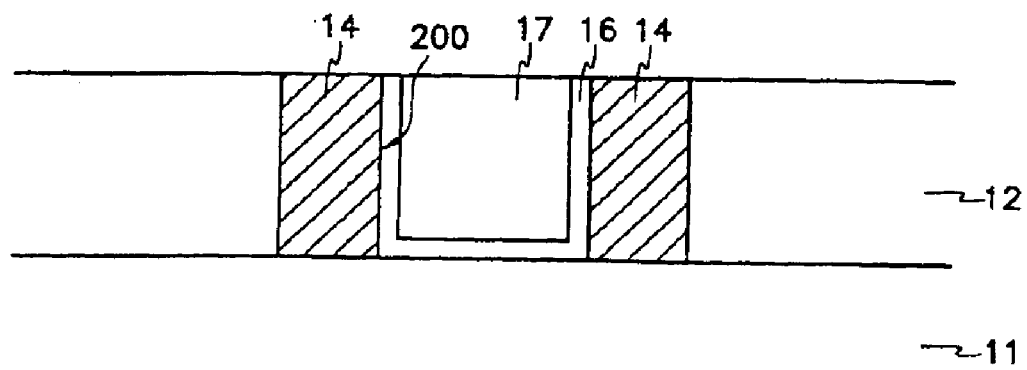

Then, as shown in FIG. 2e, a metal material 17, such as W, Ti, TiN, or Al, is deposited on the dielectric layer 16 to fill in the capacitor window 200. At this point, the metal material 17 corresponds to a second electrode layer of an MIM capacitor.

In this regards, because the dielectric layer 16 is formed on inner wall of the capacitor window, compared a conventional capacitor, a first electrode layer, a dielectric layer, and a second electrode layer have broader contact size.

As described above, according to the present invention, because an interlayer insulating film is selectively etched to form a first electrode layer, and capacitor window is formed between them, and then a dielectric layer is formed on the inner wall of the capacitor window and a second electrode layer is formed to fill in the capacitor window, there is effect that contact size of the first electrode layer, a dielectric layer, and a second electrode layer come to broader and thus capacitance of the capacitor is increased.

Accordingly, capacitance of capacitor in minimized semiconductor device comes to be ensured.

Although preferred embodiment of the present invention have been described in detail hereinabove, it should be clearly understood that many variations and/or modifications of the basic inventive concepts herein taught which may appear to those skilled in the present art will still fall within the spirit and scope of the present invention, as defined in the appended claims.

What is claimed is:

1. A method of fabricating a thin film capacitor, the method comprising:

forming an interlayer insulating film over an entire surface of a semiconductor substrate;

forming a first via and a second via in the interlayer insulating film that are spaced a predetermined distance from each other by selectively etching the interlayer insulating film;

filling in the first via and the second via with a first metal material, wherein the first metal material is planarized by chemical mechanical polishing to expose the interlayer insulating film such that the first via and the second via remain filled with the first metal material, wherein opposing surfaces of the first metal material in the first via and the second via are contacted by the interlayer insulating film;

forming a capacitor window by etching the interlayer insulating film the entire predetermined distance between the first via and the second via to have a predetermined depth such that semiconductor substrate is exposed in the capacitor window, wherein one surface of the first metal material in the first via remains in contact with the interlayer insulating film and one surface of the first metal material in the second via remains in contact with the interlayer insulating film;

forming a dielectric layer on an inner wall of the capacitor window and the exposed semiconductor substrate; and forming a second metal material to fill in the capacitor window.

2. The method of claim 1, wherein the first via and the second via is formed by applying a photoresistive film on the interlayer insulating film and exposing and developing the photoresistive film to form a photoresistive film pattern which exposes a portion of the interlayer insulating film where the first via and the second via having linear shape are to be formed, and then etching the exposed interlayer insulating film using the photoresistive film pattern as a mask to form the first via and the second via.

3. The method of claim 2, wherein the first via and the second via is filled with the first metal material by depositing tungsten over the entire upper surface of the interlayer insulating film including the first via and the second via to fill in the first via and the second via, and then carrying out a planarization process of chemical mechanical polishing until the interlayer insulating film is exposed.

4. The method of claim 3, wherein the dielectric layer is formed by forming a dielectric layer on the entire upper surface of the first metal material and the interlayer insulating film and forming the second metal material on the dielectric layer to fill in the capacitor window, and then carrying out the planarization process of chemical mechanical polishing until the interlayer insulating film and the first material are exposed.

5. The method of claim 1, wherein the second metal material is formed of one selected from a group consisting of W, Ti, TiN, and Al.

6. The method of claim 2, wherein the second metal material is formed of one selected from a group consisting of W, Ti, TiN, and Al.

7. The method of claim 3, wherein the second metal material is formed of one selected from a group consisting of W, Ti, TiN, and Al.

8. The method of claim 4, wherein the second metal material is formed of one selected from a group consisting of W, Ti, TiN, and Al.

* * * * *